(12) United States Patent
Suzuki et al.

(10) Patent No.: US 11,948,931 B2
(45) Date of Patent: Apr. 2, 2024

(54) APPARATUSES INCLUDING SEMICONDUCTOR LAYOUT TO MITIGATE LOCAL LAYOUT EFFECTS

(71) Applicant: MICRON TECHNOLOGY, INC., Boise, ID (US)

(72) Inventors: Ryota Suzuki, Sagamihara (JP); Hirokazu Matsumoto, Hachioji (JP); Makoto Sato, Sagamihara (JP)

(73) Assignee: MICRON TECHNOLOGY, INC., Boise, ID (US)

( * ) Notice: Subject to any disclaimer, the term of this patent is extended or adjusted under 35 U.S.C. 154(b) by 128 days.

(21) Appl. No.: 17/169,189

(22) Filed: Feb. 5, 2021

(65) Prior Publication Data
US 2022/0254768 A1   Aug. 11, 2022

(51) Int. Cl.
*H01L 27/02* (2006.01)
*H01L 29/423* (2006.01)

(52) U.S. Cl.
CPC .... *H01L 27/0207* (2013.01); *H01L 29/42376* (2013.01)

(58) Field of Classification Search
CPC .......... H01L 27/0207; H01L 29/42376; H01L 23/528; H01L 27/11807; H01L 21/823437; H01L 21/823475; H01L 27/088; H01L 2027/11866; H01L 2027/11874; H01L 27/10897
See application file for complete search history.

(56) References Cited

U.S. PATENT DOCUMENTS

| 6,084,255 A * | 7/2000 | Ueda ................ H01L 27/11807 257/351 |
| 2008/0283871 A1* | 11/2008 | Hamada ............. H01L 27/0207 257/202 |

* cited by examiner

*Primary Examiner* — Nelson Garces
(74) *Attorney, Agent, or Firm* — Dorsey & Whitney LLP

(57) ABSTRACT

Apparatuses including semiconductor layout to mitigate local layout effects are disclosed. An example apparatus includes a plurality of standard cells each including an active region, an isolation region adjacent the active region, and a first gate structure disposed on the active region and the isolation region. The first gate structure includes a first gate portion disposed on the active region, and a first contact portion disposed on the isolation region. The apparatus further includes a second gate structure disposed on the active region and the isolation region. The second gate structure includes a second gate portion disposed on the active region, and a second contact portion disposed on the isolation region. In the apparatus, a distance between a first contact point and the first gate portion is substantially equal to a distance between a second contact point and the second gate portion.

21 Claims, 6 Drawing Sheets

APPARATUSES INCLUDING SEMICONDUCTOR LAYOUT TO MITIGATE LOCAL LAYOUT EFFECTS

BACKGROUND

In DRAM, data may be stored in individual memory cells of the DRAM. The memory cells may be organized in an array of rows and columns. Each memory cell in a row may be coupled to a word line and each memory cell in a column may be coupled to a bit line. Thus, every memory cell is coupled to a word line and a bit line. Logic circuits peripheral to the memory array may control various memory functions, for example, accessing one or more memory cells of the memory array to read data from or write data to the memory cells.

As MOS FETs used in semiconductor devices aim to achieve high performance and low power, at rite same time higher density and low cost are still demanded. Thus, use of High Performance CMOSs (HPC) is becoming more popular in semiconductor devices such as memories and logic circuits. HPC may rely on use of thin high k gate insulator with high dielectric constant for its high performance with low power and reduced leakage current. However. HPC may be susceptible to Local Layout Effects (LLE). LLE are environmental effects involving layout design that may induce variance in threshold voltage (Vt) of HPC transistors within a semiconductor device. Thus, there is a need to reduce LLE in semiconductor devices.

DETAILED DESCRIPTION

The following description of certain embodiments is merely exemplary in nature and is in no way intended to limit the scope of the disclosure or its applications or uses. In the following detailed description of embodiments of the present apparatus and methods, reference is made to the accompanying drawings which form a part hereof, and which are shown by way of illustration specific embodiments in which the described apparatuses and methods may be practiced. These embodiments are described in sufficient detail to enable those skilled in the art to practice presently disclosed apparatuses and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Various layout designs may be used in a variety of semiconductor devices, such as controllers and memory devices. For example, logic circuits peripheral to a memory array in a memory device (e.g., DRAM, FeRAM, STT-RAM, SRAM, etc.) may control various memory functions, for example, accessing one or more memory cells of the memory array to read data from or write data to the memory cells. Due to scaling down of physical dimensions in a semiconductor device with compact placement of elements in a limited area, technologies such as shallow trench isolation (STI) and high-k gate insulator may be used to improve performance of transistors in a memory array and logic elements peripheral to the memory array. However, the layout designs described herein are not limited to these specific applications. For example, the layout designs may be included in other memory types (e.g., FeRAM, STT-RAM, etc.) and/or other semiconductor devices (e.g., controllers, processors, analog devices, power devices, and the like).

Figure 1:
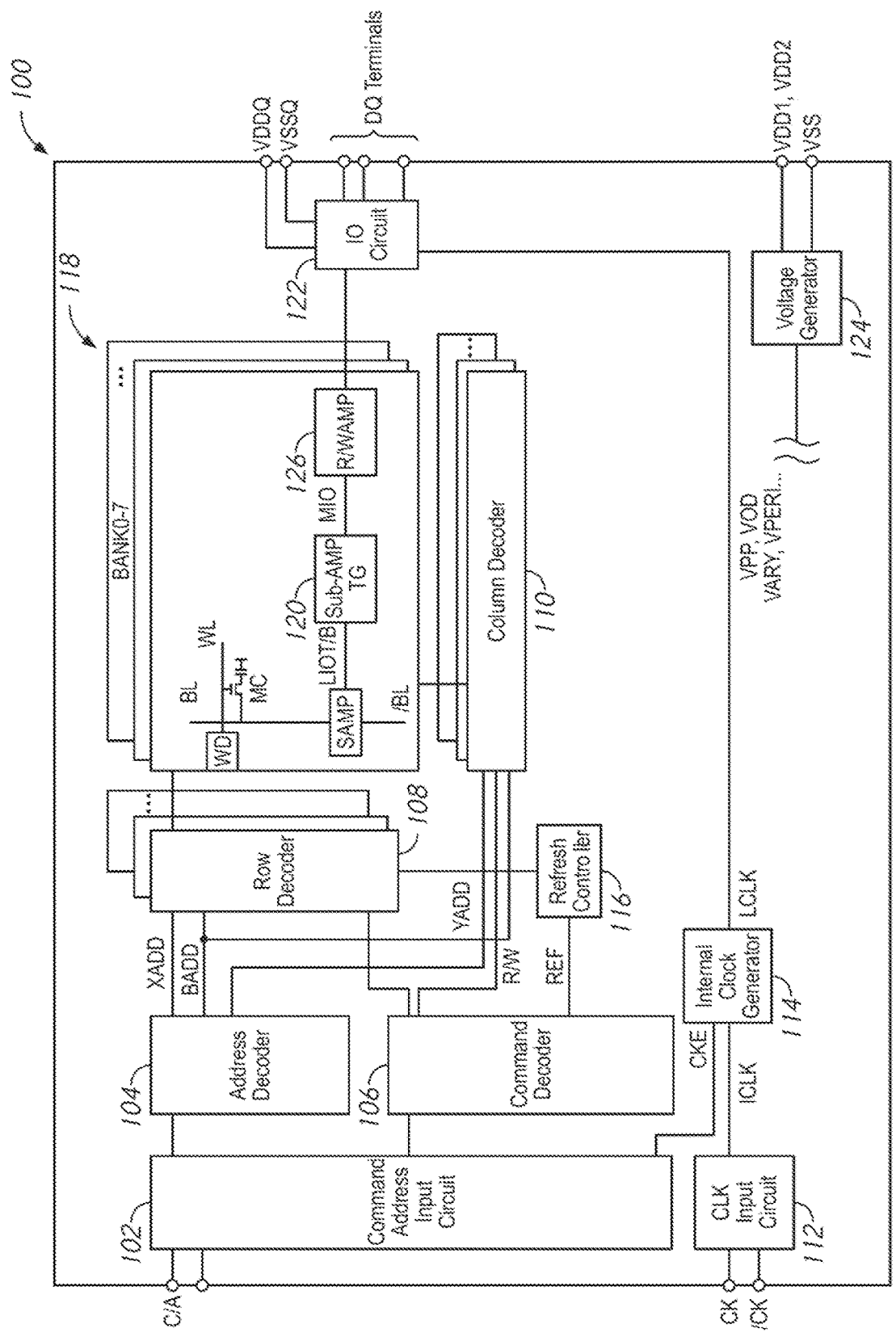
FIG. 1 is a block diagram of a semiconductor device according to some examples described in the disclosure.

FIG. 1 of a semiconductor device according to some examples described in the disclosure. The semiconductor device 100 may be a semiconductor memory device, such as a DRAM device integrated on a single semiconductor chip. The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 in other embodiments. Each memory bank includes a plurality of word lines WL, a plurality of bit lines BL and BL, and a plurality of memory cells MC arranged at intersections of the plurality of word lines WL and the plurality of bit lines BL and /BL. The selection of the word line WL is performed by a row decoder 108 and the selection of the bit lines BL and /BL is performed by a column decoder 110. A selected word line WL may be driven to a desired charge by word line driver WD. In the embodiment of FIG. 1, the row decoder 108 includes a respective row decoder for each memory bank and the column decoder 110 includes a respective column decoder for each bank. The bit lines BL and /BL are coupled to a respective sense amplifier (SAMP).

Read data from the bit line BL or /BL is amplified by the sense amplifier SAMP, and provided to sub-amplifier transfer gate 120 over complementary local data lines (LIOT/B). The sub-amplifier transfer gate 120 may act as a switch to form a conductive path between the appropriate LIOT/B and appropriate shared main data lines (MIO). Read data may pass from the local data lines LIOT/B to the main data lines MIO via a conductive path provided by the sub-amplifier transfer gate 120 to a read amplifier 126, which prov ides the data to an IO circuit 122. Write data received from IO circuit 122 is output from a write amplifier 126 and provided to the sense amplifier SAMP over the complementary main data lines MIO, the sub-amp transfer gate 120, and the complementary local data lines LIOT/B, and written in the memory cell MC coupled to the bit line BL or/BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDDJ, VDD2, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are provided, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line WL and a column command signal to select a bit line BL.

The device 100 may receive an access command which is a read command. When an activate command and a read command are received, and a bank address, a row address and a column address are timely supplied with the activate and read commands, read data is read from memory cells MC in the memory array 118 corresponding to the row address and column address. The activate and read commands are received by the command decoder 106 (e.g., command controller), which provides internal commands so that read data from the memory array 218 is provided to the read amplifier 128. The read data is output to outside from the data terminals DQ via the input/output circuit 122.

The device 100 may receive an access command which is a write command. When an activate command and a write command are received, and a batik address, a row address and a column address are timely supplied with the activate and write commands, write data supplied to the data terminals DQ is written to a memory cells in the memory array 118 corresponding to the row address and column address. The activate and write commands are received by the command decoder 106, which provides internal commands so that the write data is received by data receivers in the input/output circuit 122. Write clocks may also be provided to the external clock terminals for timing the receipt of the w rite data by the data receivers of the input/output circuit 122. The write data is supplied via the input/output circuit 122 to the write amplifier 126, and by the write amplifier 126 to the memory array 118 to be written into the memory cell MC.

The device 100 may also receive commands causing it to carry out a refresh operation. The refresh signal may be a pulse signal which is activated when the command decoder 106 receives a signal which indicates an auto-refresh and/or other refresh command. In some embodiments, the refresh command may be externally issued to the memory device 100. In some embodiments, the refresh command may be periodically generated by a component of the device 100. The refresh signal is provided to the refresh controller 116. A refresh command provided to the refresh controller 116 may cause the device 100 to carry out refresh operations for one or more of the memory banks.

Power supply terminals of device 100 are supplied with power supply potentials VDD1, VDD2, and VSS. The power supply potentials VDD1, VDD2, and VSS are supplied to an internal voltage generator circuit 124. The internal voltage generator circuit 124 generates various internal potentials VPP, VOD, VARY, VPERI, and the like based on the power supply potentials VDD1, VDD2, and VSS supplied to the power supply terminals. While the various internal potentials and power supply potentials may be used for any of the different circuits of the device 100, the internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to tire power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input-output circuit 122 does not propagate to the other circuit blocks. One or more of the circuits previously described that are peripheral to the memory array 118, for example, decoders, controllers, standard cells including circuits, etc. may be included in the semiconductor device 100 as peripheral circuitry.

Figure 2:
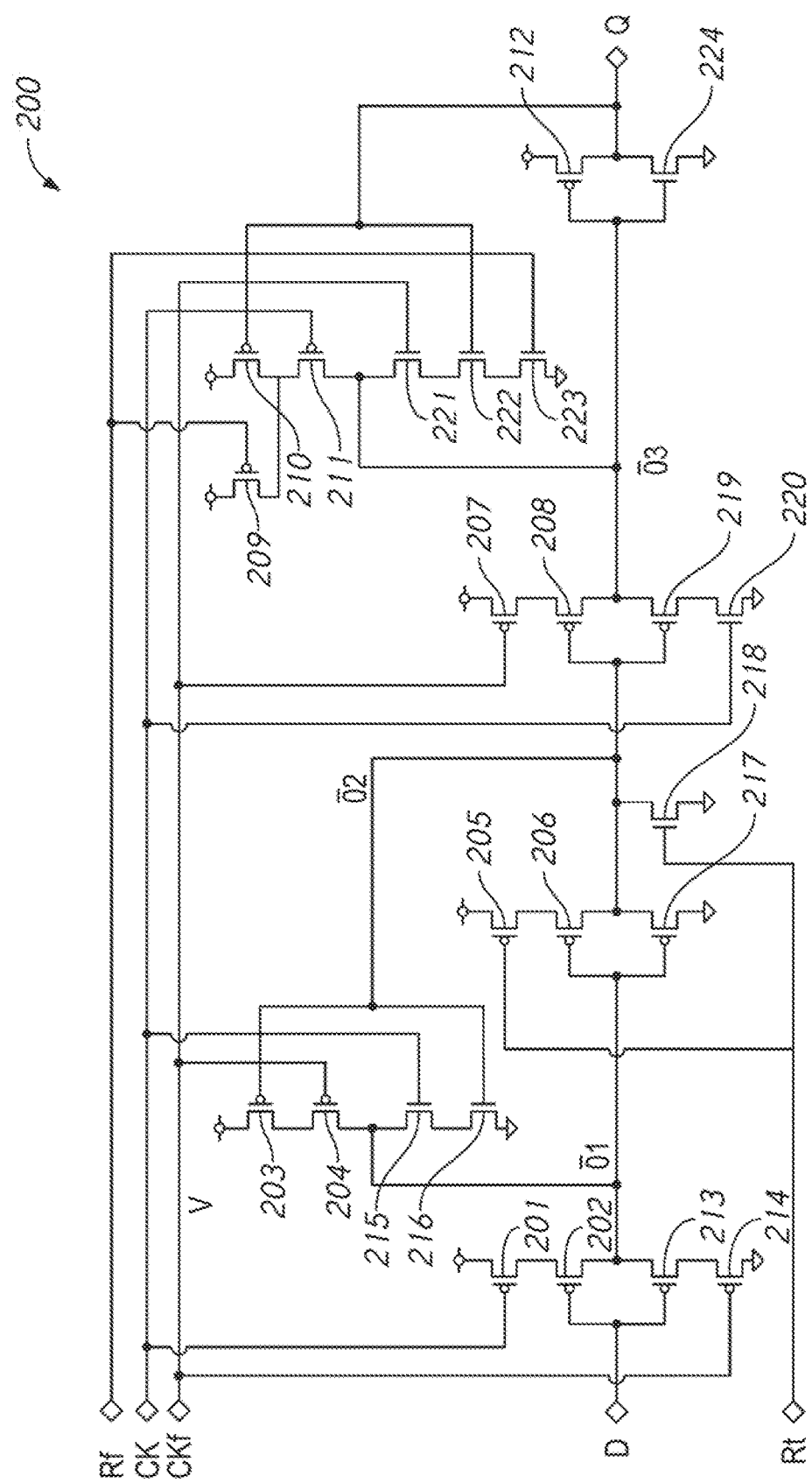
FIG. 2 is a schematic diagram of a circuit according to some examples described in the disclosure.

FIG. 2 is an example of a standard cell 200 according to some examples described in the disclosure. In some examples, the standard cell 200 may be included in variety of circuits in device 100 or a portion of device 100 shown in FIG. 1. Standard cells may include one or more circuits. For example, in some embodiments of the disclosure, the standard cell 200 includes a flip flop circuit. However, any circuit utilizing a plurality of transistors may be included in embodiments of the disclosure.

The standard cell 200 may include p-channel transistors 201-212 and n-channel transistors 213-224. The gates of p-channel transistor 201 is and n-channel transistor 215 are coupled to node CK. The gates of p-channel transistor 204 and n-channel transistor 214 are coupled to node CKf. The gates of p-channel transistor 202 and n-channel transistor 213 are coupled to node D The sources of p-channel transistors 201 and 203 are coupled to node V. The drain of p-channel transistor 201 is coupled to the source of p-channel transistor 202. The drains of p-channel transistor 202 and 204 are coupled to node O1. The gates of p-channel transistor 203 and n-channel transistor 216 are coupled to node O2.

Nodes Rf, CK, CKf, D and Rt are inputs of the standard cell 200. Of these inputs, CK and CKf denote input of clock signals. D denotes input of data signal and Rf and Rt denote input of control signals. Node Q denotes an output of the standard cell 200.

The transistors used in the standard cell 200 will be described later in more detail with reference to a layout diagram of FIG. 3 for the standard cell 200 and layout diagrams of FIGS. 5A, 5B and 5C. These transistors may be implemented on a semiconductor device based on, for example, a complementary MOS (CMOS) process. Certain CMOS processes are capable of fabricating UPC transistors that rely on use of thin high-k gate insulator with high dielectric constant for its high performance with low power and reduced leak current. However, any processes based on MOS FET transistors may implement features of the embodiments of the disclosure.

Figure 3:
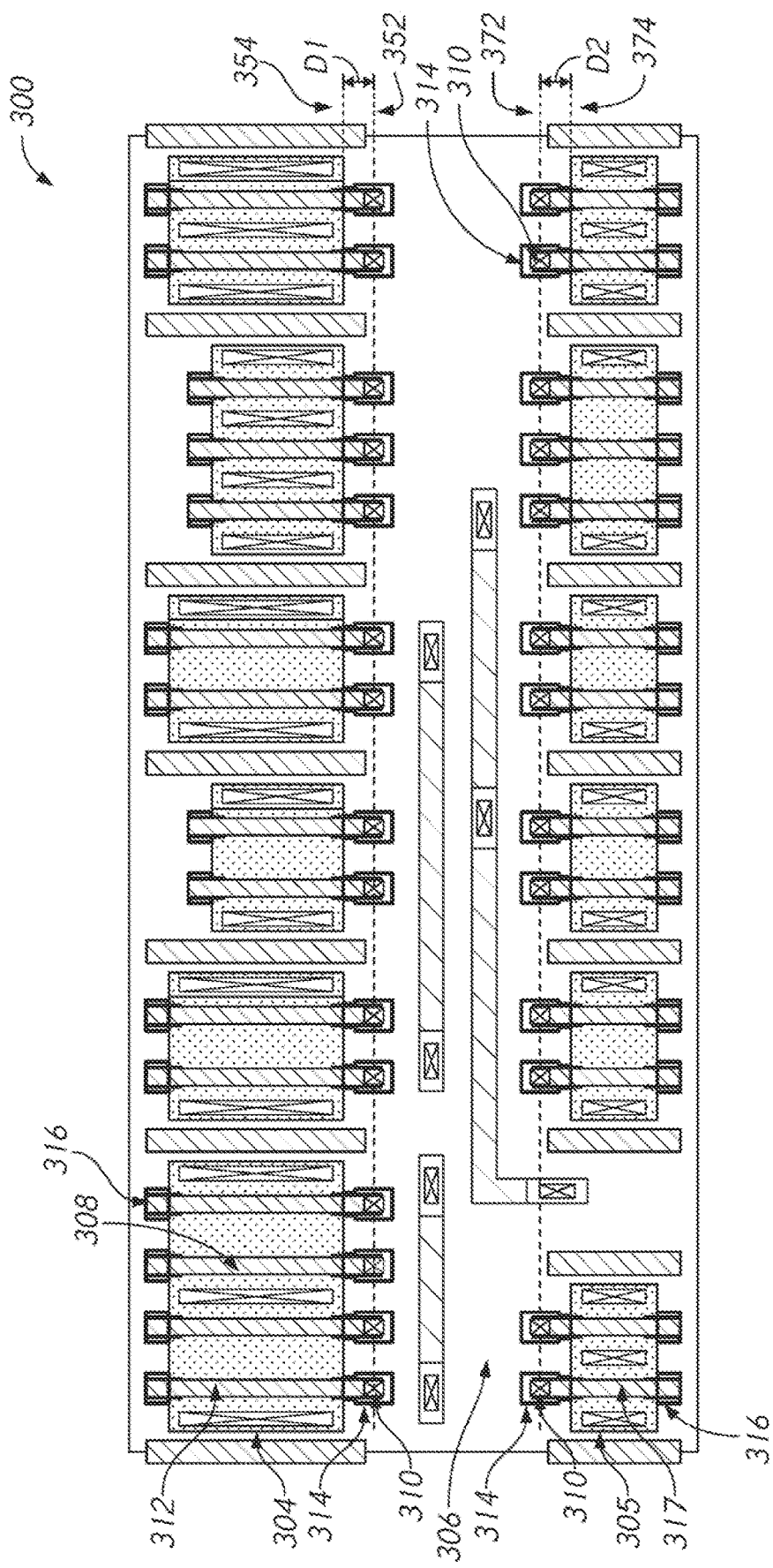
FIG. 3 is a layout diagram of a portion of the circuit shown in FIG. 2 according to an embodiment of the disclosure.

FIG. 3 is a layout diagram 300 of the standard cell 200 shown in FIG. 2 according to an embodiments of the disclosure. In some examples, the layout diagram 300 may be used in a portion of device 100 shown in FIG. 1. The layout diagram 300 includes an active region 304, an isolation region 306, a polysilicon layer 308 and contacts 310. The layout diagram 300 may include a plurality of p-channel transistors formed in the active region 304 with a p type diffusion and a plurality of n-channel transistors formed in an active region 305 with an n type diffusion. In some embodiments of the disclosure, the plurality of p-channel transistors in the active region (p+) 304 include the p-channel transistors 201-212 and the plurality of n-channel transistors in the active region (n+) 305 include the n-channel transistors 213-224 shown in the schematic diagram of FIG. 2.

In FIG. 3, the polysilicon layer 308 includes p gate structures that include gate portions 312 in the active region 304 with the p type diffusion, a contact portion 314 and an end portion 316 on the isolation region 306. The contact portion 314 includes a contact point 311 configured to be connected to a contact 310. In FIG. 3, a location of the contact point 311 coincides with the center of the contact 310. However, the location of the contact point 311 within the contact 310 may be anywhere in the contact portion 314 as long as the location is consistent with other contact portions. The gate portion 312 of the p gate structure 301 forms a p-channel transistor. In FIG. 3, the contact portion 314 and the end portion 316 of the p gate structure 301 are shown with surrounding shapes in bold. The contact portions 314 are connected to a corresponding contact 310. Each contact portion 314 is delineated by a p contact line 352 passing through the center of the contact 310. An edge of the active region 304 with the p type diffusion is delineated by a p active line 354 in FIG. 3. The p contact line 352 is parallel to an edge of the active region 304. A distance between the p contact line 352 and the p active line 354 is shown as d1 and remains constant for at least two of p gate structures. An area of the contact portion 314 of one of the p gate structures may be same (e.g., equal to, substantially equal to, etc.) as an area of the contact portion 314 of at least another one of the p gate structures. An area of the end portion 316 of one of the p gate structures may be same (e.g., equal to, substantially equal to, etc.) as an area of the end portion 316 of at least another one of the p gate structures.

In FIG. 3, in a similar manner as the p-channel transistor, the layout diagram 300 may include a plurality of n-channel transistors formed in an active region 305 with an n type diffusion. The polysilicon layer 308 also includes n gate structures that include gate portions 317 in the active region 305 with the n type diffusion, a contact portion 314 and an end portion 316 on the isolation 306. The gate portion 317 of the n gate structure 302 forms the n-channel transistor. In some embodiments of the disclosure, the plurality of n-channel transistors include the n-channel transistors 213-224 shown in the schematic diagram of FIG. 2. In FIG. 3, the contact portion 314 and the end portion 316 of the n gate structure 302 are shown with surrounding shapes in bold. The contact portions 314 are connected to a corresponding contact 310 via a contact point 311. Each contact portion 314 is delineated by an n contact line 372 passing through the center of the contact 310. An edge of the active region 305 with the n type diffusion is delineated by an n active line 374 in FIG. 3. The n contact line 372 is parallel to an edge of the active region 305. A distance between the n contact line 372 and the n active line 374 is shown as d2 and remains constant for at least two of n gale structures. An area of the contact portion 314 of one of the n gate structures may be same (e.g., equal to, substantially equal to, etc.) as an area of the contact portion 314 of at least another one of the n gate structures. An area of the end portion 316 of one of the n gate structures may be same (e.g., equal to, substantially equal to, etc.) as an area of the end portion 316 of at least another one of the n gate structures.

In a certain embodiment, the distance d1 between the p contact line 352 and the p active line 354 may not be same as the distance d2 between the n contact line 372 and the n active line 374 when the distance d1 remains constant for at least two p-channel transistors and the distance d2 remains constant for at least two n-channel transistors. In a certain embodiment, the area of the contact portion 314 of the p gate structure may not be same as the area of the contact portion 314 of the n gate structure when areas of the contact portion 314 of at least two n gate structures are same. Similarly, the area of the end portion 316 of the p gate structure 301 may not be same as the area of the end portion 316 of the n gate structure 302 when areas of the contact portion 316 of at least two n gate structures are same and areas of the contact portion 316 of at least two p gate structures are same.

Figure 4:
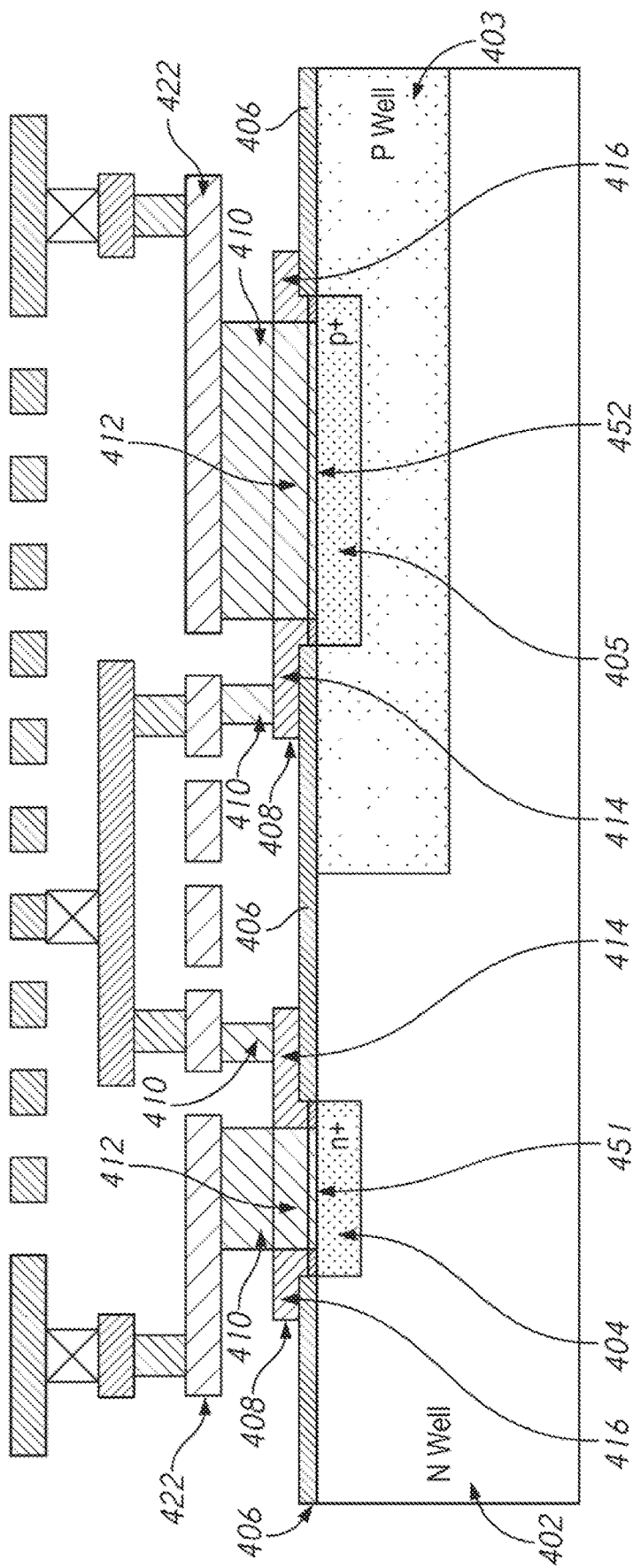
FIG. 4 is a partial cross sectional view of the layout diagram of FIG. 3 according to an embodiment of the disclosure.

FIG. 4 is a partial cross sectional view 400 of the layout diagram 300 of FIG. 3 according to an embodiment of the disclosure. The cross sectional view 400 includes a pwell 402, an nwell 403, active regions (n+) 404, active regions (p+) 405, an isolation region 406, a polysilicon layer 408, a contact 410 and a metal0 layer 412. The pwell 402 may include the active regions 404 with n type diffusion. The nwell 403 may include the active region 404 with p type diffusion. An isolation region 406 is disposed adjacent the active regions 404 in the pwell 402 or adjacent the active region 405 in die nwell 403. The isolation region 406 may be formed by having a trench in a substrate that is filled with one or more dielectric materials such as silicon dioxide. The active region 404 with the n type diffusion may be formed in the pwell 402. The active region 405 with the p type diffusion may be formed in the nwell 403. The isolation region 406 may prevent current leakage between adjacent active regions.

An n-channel transistor 451 includes a gate portion 412 of the n gate structure on a gate insulator film formed in the active region 404 with the n type diffusion. The gate insulator film may be formed of a thin oxide material having a high dielectric constant to reduce leakage current of the gate insulator film. As can be seen in FIG. 4, the contact portion 414 of the n gate structure extends beyond the gate portion 412 and an edge of the active region 404 to the isolation region 406. T be end portion 416 of the n gate structure extends beyond the gate portion 412 and an opposite edge of the active region 404 relative to contact portion side to the isolation region 406. Threshold voltage (Vt) variation of the n-channel transistor 451 may depend on a total area of the contact portion 414 and the end portion 416 of the n gate structure on the isolation region 406. The total area may relate to absorption of oxygen by the n-channel transistor 451 from the isolation region 406. By having gate structures of the n-channel transistors with similar total areas on the isolation regions. Vt variation for the different n-channel transistors may be reduced.

In a similar manner as the n-channel transistor 451, a p-channel transistor 452 includes a gate portion 412 of the p gate structure on a gate insulator film formed in the active region 405 with the p type diffusion. The gate insulator film may be formed of a thin oxide material having a high dielectric constant to reduce leakage current of the gate insulator film. As can be seen in FIG. 4, the polysilicon region 408 on both sides of tire n-channel transistor 452 extends to the isolation region 406 forming a contact portion 414 on a side with a contact 410 and an end portion 416 on the other side. Threshold voltage (Vt) variation of the p-channel transistor 452 may depend on a total area of the contact portion 414 and the end portion 416 of the p gate structure on the isolation region 406. The total area may relate to absorption of oxygen by the p-channel transistor 452 from the isolation region 406. By having gate structures of the p-channel transistors with similar total areas on the isolation regions, Vt variation for the different p-channel transistors may be reduced.

Figure 5:
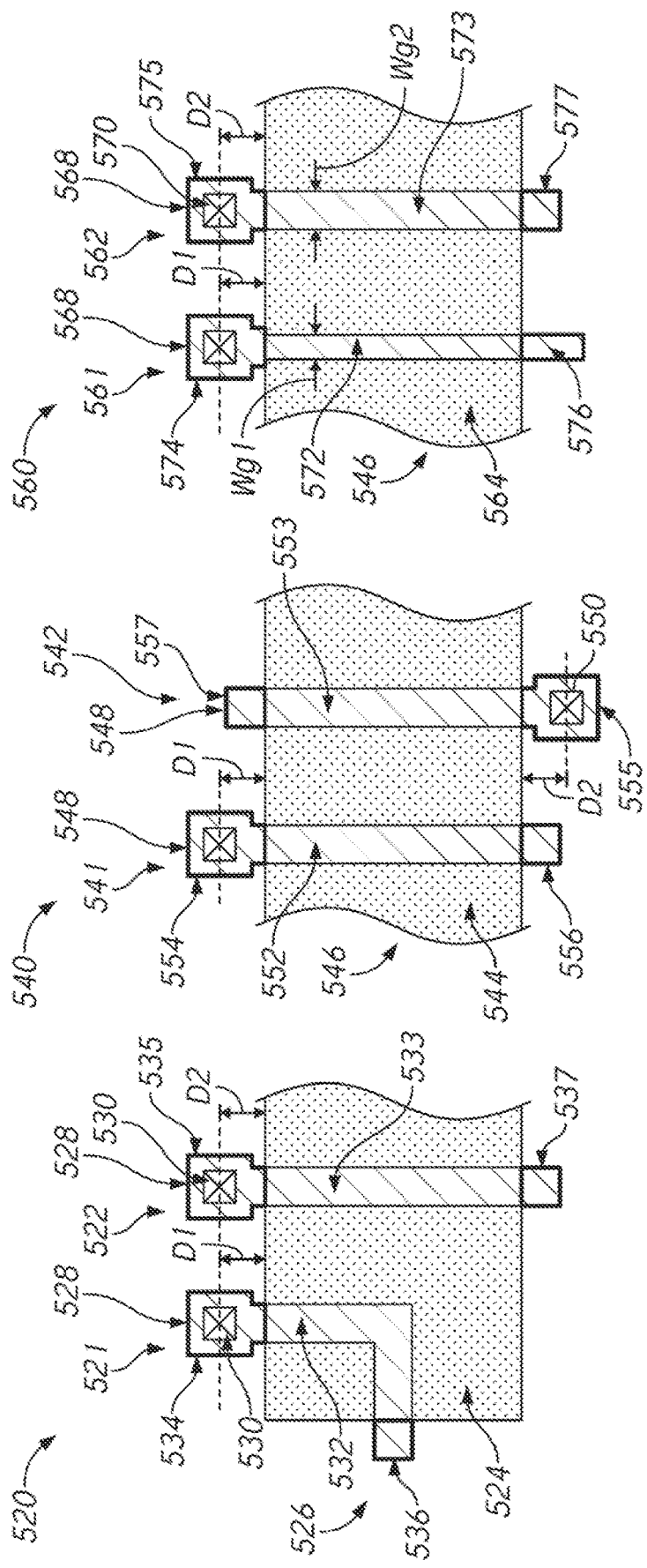
FIG. 5A is a layout diagram of a portion of the circuit shown in FIG. 2 according to an embodiment of the disclosure.
FIG. 5B is a layout diagram of a portion of the circuit shown in FIG. 2 according to an embodiment of the disclosure.
FIG. 5C is a layout diagram of a portion of the circuit shown in FIG. 2 according to an embodiment of the disclosure.

FIG. 5A is a layout diagram 520 of a portion of the circuit shown in FIG. 2 according to an embodiment of the disclosure. The layout diagram 520 includes two transistors formed in an active region 524. As shown in FIG. 5A, a first gate structure 521 including a first gate portion 532 in an active region 524, a first contact portion 534 and a first end portion 536 on an isolation region 526 is formed in a semiconductor device. A second gate structure 522 including a second gate portion 533 in the active region 524, a second contact portion 535 and a second end portion 537 on the isolation region 526 is formed in the semiconductor device, in addition to these gate structures, the active region 524 may accommodate a plurality of other gate structures forming a plurality of transistors. The first contact portion 534 and the second contact portion 535 may have a same size. The first contact portion 534 and the second contact portion 535 may have a same shape. The first gate portion 532 has a first shape that may lie a bent shape or a curved shape. The second gate portion 533 may have a straight rectangular shape. Lengths of the first and second gate portions 532, 533 may be of a same length or of any length. However, a distance d1 between the center of the first contact portion 534 and the first gate portion 532 is the same at least with a distance d2 between the center of the second contact portion 535 and the second gate portion 533 as shown in FIG. 5A. In another embodiment, d1 and d2 may not remain the same, but a total area of the first contact portion 534 and the first end portion 536 is the same (e.g., equal to, substantially equal to, etc.) at least with a total area of the second contact portion 535 and the second end portion 537.

FIG. 5B is a layout diagram 540 of a portion of the circuit shown in FIG. 2 according to an embodiment of the disclosure. The layout diagram 540 includes two transistors formed in an active region. As shown in FIG. 5B, a first gate structure 541 including a first gate portion 552 in an active region 544, a first contact portion 554 and a first end portion 556 on an isolation region 546 is formed in a semiconductor device. A second gate structure 542 including a second gate portion 553 in the active region 544, a second contact portion 555 and a second end portion 557 on the isolation region 546 is formed in the semiconductor device. In addition to these gate structures, the active region 544 may accommodate a plurality of other gate structures. The first contact portion 554 and the second contact portion 555 may have a same size, in this embodiment, the second contact portion 555 is disposed on an opposite side of the active region 544 with respect to the first contact portion 554 as shown in FIG. 5B. A distance d1 between the center of the first contact portion 554 and the first gate portion 552 remains same with a distance d2 between the center of the second contact portion 555 and the second gate portion 553. A width of the first gate portion 552 may be equal or different to a width of the second gate portion 553 as in FIG. 5B and FIG. 5C. In another embodiment, d1 and d2 may not be the same, but a total area of the first contact portion 554 and the first end portion 556 remains the same with a total area of the second contact portion 555 and the second end portion 557.

FIG. 5C is a layout diagram 560 of a portion of the circuit shown in FIG. 2 according to an embodiment of the disclosure. The layout 560 includes two transistors formed in an active region. As show in FIG. 50, a first gate structure 561 including a first gate portion 572 in an active region 564, a first contact portion 574 and a first end portion 576 on an isolation region 566 is formed in a semiconductor device. A second gate structure 562 including a second gate portion 573 in the active region 564, a second contact portion 575 and a second end portion 577 on the isolation region 566 is formed in the semiconductor device. In addition to these gate structures, the active region 564 may accommodate a plurality of other gate structures. The first contact portion 574 and the second contact portion 575 may have a same size. In this embodiment, a width wg1 of the first gate portion 572 may be different from a width wg2 of the second gate portion 573. In some embodiments of the disclosure, due to the different widths of wg1 and wg2, the first contact portion 574 and/or first end portion 576 have different shapes than the second contact portion 575 and/or second end portion 577, but the total area of the first contact portion 574 and first end portion 576 is the same as the total area of the second contact portion 575 and the second end portion 577. Widths of gate portions of other gate structures may be same as wg1 or wg2, or different from wg1 or wg2. In a similar manner as in FIG. 5B, a distance d1 between the center of the first contact portion 574 and the first gate portion 572 remains same with a distance d2 between the center of the second contact portion 575 and the second gate portion 573. In another embodiment, d1 and d2 may not be the same but a total area of the first contact portion 574 and the first end portion 576 remains the same with a total area of the second contact portion 575 and the second end portion 577.

Figure 6:
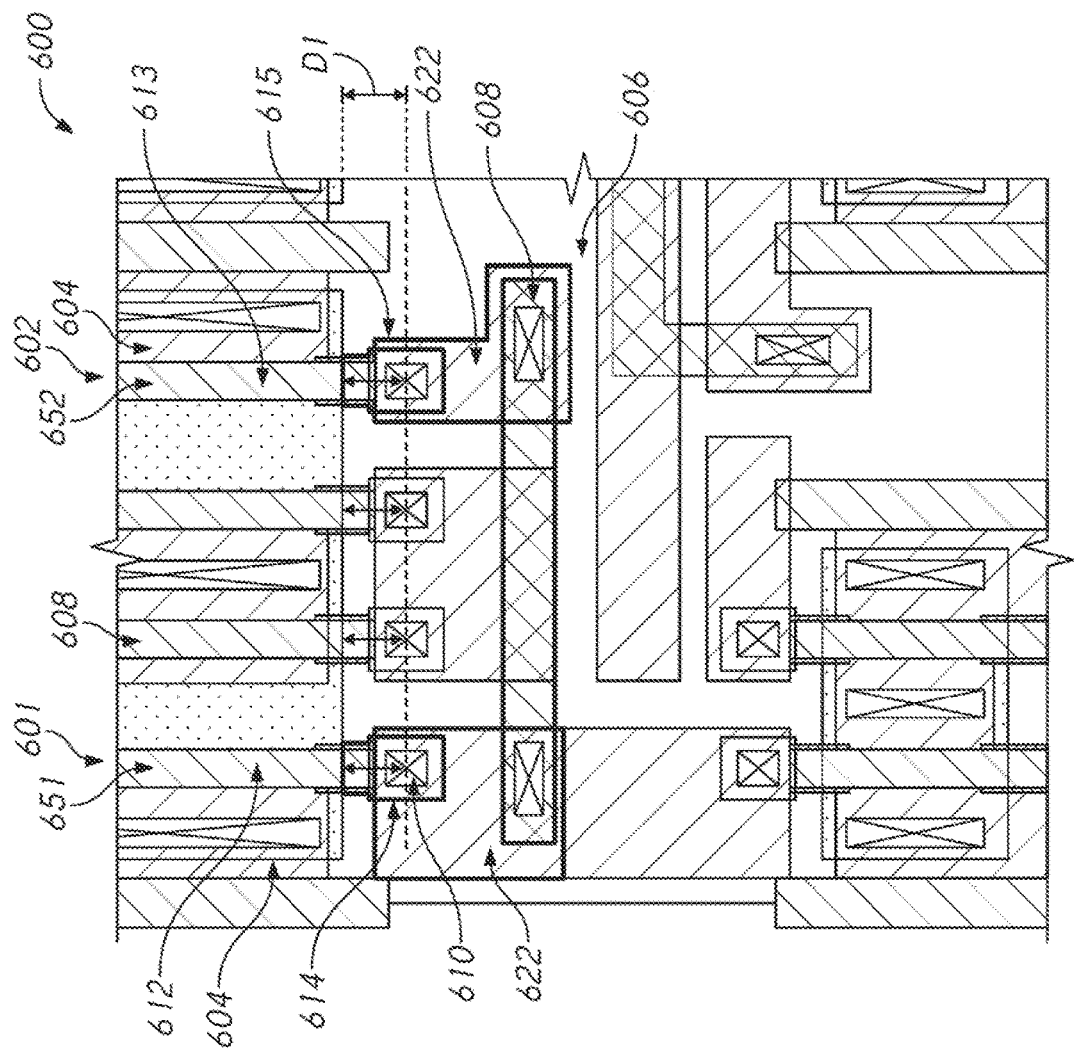
FIG. 6 is a layout diagram of a portion of the circuit shown in FIG. 2 according to an embodiment of the disclosure.

FIG. 6 is a layout diagram 600 of a portion of the circuit shown in FIG. 2 according to an embodiment of the disclosure. The layout diagram 600 includes a poly bridge coupling two transistors together. As shown in FIG. 6, a transistor 651 is disposed on a substrate of a semiconductor device including an active region 604, an isolation region 606, a polysilicon layer 608, a contact 610 and a metal0 layer 622. The transistor 651 includes a first gate structure 601 including a first contact portion 614, a first gate portion 612 and a first end portion 616 (not shown). The first contact portion 614 is connected to a corresponding contact 610. Similarly, a transistor 652 includes a second gate structure 602 including a second contact portion 615, a second gate portion 613 and a second end portion 617 (not shown).

In this embodiment, a distance d1 between a dotted line delineating the center of each contact 610 of a plurality of transistors including the transistors 651 and 652 and an edge of the active region 604 remains constant for the transistors 651 and 652. Further, the first and second contact portions 614, 615 have a same size. The transistors 651 and 652 are coupled together with a poly bridge 3 (annotated with 3 in FIG. 6) included in the polysilicon layer 608. The first contact portion 614 of the transistor 651 is coupled to a first metal portion 2 (annotated with 2 in FIG. 6) which in turn is coupled to the poly bridge 3. The poly bridge 3 extends to a second metal portion 3 (also annotated with 2 in FIG. 6) and coupled to the second contact portion 615 through the second metal portion 3. The first metal portion 2 and the second metal portion 3 may be included in the metal0 layer 622. FIG. 6 illustrates an example of coupling two transistors together using the polysilicon layer 608 without directly connecting the polysilicon layer 608 to the gate structures of the transistors. Transistors disposed in different active regions regardless of the type of diffusion may also be coupled in a similar manner. Further, other variations of coupling transistors are, of course possible, without deviating from an intended scope of the embodiments of the disclosure.

Various circuits in addition to the circuit as illustrated in FIG. 2 may include features of the layout diagrams as described in the present disclosure. In some embodiments of the disclosure, the circuits utilizing the features may be included in a memory device, such as semiconductor device 100 shown in FIG. 1. However, in other embodiments of the disclosure, the circuits may be used in other semiconductor devices, including, but not limited to: controllers and processors. Transistors including features of the layout diagrams as discussed in the disclosure and included in semiconductor devices may exhibit less Vt variations for the different transistors.

Of course, it is to be appreciated that any one of the examples, embodiments or processes described herein may be combined with one or more other examples, embodiments and/or processes or be separated and/or performed amongst separate devices or device portions in accordance with the present apparatuses, devices and methods.

Finally, the above-discussion is intended to be merely illustrative of the present apparatus and should not be construed as limiting the appended claims to any particular embodiment or group of embodiments. Thus, while the present apparatus has been described in particular derail with reference to exemplary embodiments, it should also be appreciated that numerous modifications and alternative embodiments may be devised by those having ordinary skill in tire art without departing from the broader and intended spirit and scope of the present apparatus as set forth in the claims that follow. Accordingly, the specification and drawings are to be regarded in an illustrative manner and are not intended to limit the scope of the appended claims.

What is claimed is:

1. An apparatus, comprising:
a plurality of standard cells each including:
a first active region and a second active region;
an isolation region between the first active region and the second active region;
a plurality of first gate structures disposed on the first active region and the isolation region;
a plurality of second gate structures disposed on the second active region and the isolation region; and
a plurality of third gate structures disposed on a third active region and the isolation region, the third active region is adjacent the first active region and across the second active region,
wherein each first gate structure of the plurality of first gate structures includes:
a first gate portion disposed on the first active region; and
a first contact portion and a first end portion disposed on the isolation region, the first contact portion including a first contact point configured to be connected to a first contact,
wherein each third gate structure of the plurality of third gate structures includes:
a third gate portion disposed on the third active region; and
a third contact portion and a third end portion disposed on the isolation region, wherein the third gate portion is smaller than the first gate portion,
wherein a total area of the first contact portion and the first end portion of a first gate structure of the plurality of first gate structures is substantially equal to a total area of the third contact portion and the third end portion of each of the third gate structures of the plurality of third gate structures,
wherein each second gate structure of the plurality of second gate structures includes:
a second gate portion disposed on the second active region; and
a second contact portion and a second end portion disposed on the isolation region, the second contact portion including a second contact point configured to be connected to a second contact,
wherein a total area of the second contact portion and the second end portion of a second gate structure is substantially equal to a total area of the second contact portion and the second end portion of each of the remaining second gate structures of the plurality of second gate structures, and
wherein a distance of the first gate portion disposed on the first active region is different from a distance of the second gate portion disposed on the second active region.

2. The apparatus of claim 1, wherein a first length of the first gate portion of each first gate structure is substantially equal.

3. The apparatus of claim 1, wherein a first width of the first gate portion of each first gate structure is substantially equal.

4. The apparatus of claim 1, wherein a first width of the first gate portion is different from a second width of the second gate portion.

5. The apparatus of claim 1, wherein the first contact portion and the second contact portion are disposed along a straight line parallel to an edge of the first active region.

6. The apparatus of claim 1, wherein each of the first contact portion and the second contact portion has a same shape.

7. The apparatus of claim 1, wherein the second contact portion is disposed on the isolation region on an opposite side of the active region relative to the first contact portion.

8. The apparatus of claim 1, wherein the first gate portion includes a bend portion.

9. The apparatus of claim 1, further comprising a metal portion configured to couple the first gate structure to the second gate structure.

10. The apparatus of claim 1, further comprising a poly bridge configured to couple the first gate structure to the second gate structure through the first and second contacts.

11. A standard cell comprising:
an isolation region;
a plurality of active regions in the isolation region; and
a plurality of gate structures disposed over the plurality of active regions, respectively;
wherein the plurality of gate structures includes:
a plurality of first gate structures, each first gate structure of the plurality of first gate structures comprising:
a first gate portion disposed on a first active region of the plurality of active regions;
a first portion disposed on the isolation region, the first portion including a first contact point configured to be connected to a first contact; and
a first end portion disposed on the isolation region opposite the first portion;
a plurality of second gate structures, each second gate structure of the plurality of second gate structures comprising:
a second gate portion disposed on a second active region of the plurality of active regions;
a second portion disposed on the isolation region; the second portion including a second contact point configured to be connected to a second contact; and
a second end portion disposed on the isolation region opposite the second portion; and
a plurality of third gate structures disposed on a third active region and the isolation region, the third active region being adjacent to the first active region and across the second active region, each third gate structure of the plurality of third gate structures comprising:
a third gate portion disposed on the third active region; and
a third contact portion and a third end portion disposed on the isolation region, wherein the third gate portion is smaller than the first gate portion,
wherein a total area of the first portion and the first end portion of each first gate structure is substantially equal,
wherein the total area of the first portion the first end portion of each first gate structure is substantially equal to a total area of the third contact portion and the third end portion of each third gate structure of the plurality of third gate structures,
wherein a total area of the second portion and the second end portion of each second gate structure is substantially equal,
wherein a distance between the first gate portion and the first contact point of each first gate structure is substantially equal, and
wherein an area of the first portion is greater than an area of the first end portion.

12. The standard cell of claim 11, wherein the first portion is configured to have the first contact connected thereto and the second portion is configured to have the second contact connected thereto, and wherein a distance between the first contact and the first gate portion is substantially equal to a distance between the second contact and the second gate portion.

13. The standard cell of claim 11, wherein an area of the first portion is substantially equal to an area of the second portion.

14. The standard cell of claim 11, wherein the area of the first end portion is substantially equal to an area of the second end portion.

15. An apparatus comprising:
a first active region;
a second active region;
an isolation region between the first and second active regions;
a third active region adjacent to the first active region and across from the second active region separated by the isolation region;
a plurality of first gate structures disposed on the first active region and the isolation region,
wherein each first gate structure of the plurality of first gate structures comprises:
a first contact portion and a first end portion disposed on the isolation region, wherein the first end portion is opposite the first contact portion,
a first contact connected to the first contact portion, and
a first gate portion disposed on the first active region; and
wherein a total area of the first contact portion and the first end portion of each first gate structure is substantially equal;
a plurality of second gate structures disposed on the second active region and the isolation region,
wherein each second gate structure of the plurality of second gate structures comprises:
a second contact portion and a second end portion disposed on the isolation region,
a second contact connected to the second contact portion, and
a second gate portion disposed on the second active region,
wherein a total area of the second contact portion and the second end portion of each second grate structure is substantially equal,
wherein a first distance between the first contact and the first gate portion is substantially equal to a second distance between the second contact and the second gate portion, and
wherein a distance of the first gate portion disposed on the first active region is different than a distance of the second gate portion disposed on the second active region; and
a plurality of third gate structures disposed on the third active region and the isolation region, wherein the third gate structure comprises:
a third contact portion disposed on the isolation region;
a third contact connected to the third contact portion, and
a third gate portion disposed on the first active region, wherein the third gate structure is smaller than the first gate structure, and wherein the total area of the first portion the first end portion of each first gate structure is substantially equal to a total area of the third contact portion and the third end portion of each third gate structure of the plurality of third gate structures.

16. The apparatus of claim 15, wherein a third distance between the third contact and the third gate portion is substantially equal to the first distance and the second distance.

17. The apparatus of claim 16, wherein a first length of the first gate portion and a third length of the third gate portion are different.

18. The apparatus of claim 16, wherein the third contact portion is disposed on the isolation region on an opposite side of the first active region relative to the first contact portion.

19. The apparatus of claim 15, wherein the second contact portion is disposed on the isolation region disposed on an opposite side of the second active region relative to the first contact portion.

20. The apparatus of claim 15, wherein the first contact portion is coupled to the second contact portion through a metal portion.

21. The apparatus of claim 15, wherein the first gate structure is coupled to the second gate structure through the first contact, a poly bridge and the second contact.

* * * * *